(12) United States Patent
Liu et al.

(10) Patent No.: US 11,973,086 B2
(45) Date of Patent: Apr. 30, 2024

(54) DISPLAY PANEL

(71) Applicants: AU Optronics (Kunshan) Co., Ltd., Kunshan (CN); AU Optronics Corporation, Hsin-Chu (TW)

(72) Inventors: Chin-Chuan Liu, Hsin-Chu (TW); Fu Liang Lin, Hsin-Chu (TW)

(73) Assignees: AU OPTRONICS (KUNSHAN) CO., LTD., Kunshan (CN); AU OPTRONICS CORPORATION, Hsin-Chu (TW)

( * ) Notice: Subject to any disclaimer, the term of this patent is extended or adjusted under 35 U.S.C. 154(b) by 489 days.

(21) Appl. No.: 17/312,654

(22) PCT Filed: Oct. 21, 2019

(86) PCT No.: PCT/CN2019/112158
§ 371 (c)(1),
(2) Date: Jun. 10, 2021

(87) PCT Pub. No.: WO2021/072781
PCT Pub. Date: Apr. 22, 2021

(65) Prior Publication Data
US 2022/0052077 A1 Feb. 17, 2022

(30) Foreign Application Priority Data
Oct. 16, 2019 (CN) .......................... 201910981509.1

(51) Int. Cl.
*H01L 27/12* (2006.01)

(52) U.S. Cl.
CPC ........ *H01L 27/124* (2013.01); *H01L 27/1225* (2013.01); *H01L 27/1251* (2013.01)

(58) Field of Classification Search
CPC ............... H01L 27/124; H01L 27/1225; H01L 27/1251
(Continued)

(56) References Cited

U.S. PATENT DOCUMENTS

| 9,236,377 B2 * | 1/2016 | Kimura ............... H01L 27/1225 |
| 2011/0233617 A1 * | 9/2011 | Or-Bach ............ H01L 27/0688 257/202 |

(Continued)

FOREIGN PATENT DOCUMENTS

| CN | 107300793 A | 10/2017 |
| JP | 2000059809 A | 2/2000 |
| TW | 201921070 A | 6/2019 |

*Primary Examiner* — Sheikh Maruf
(74) *Attorney, Agent, or Firm* — WPAT, P.C

(57) ABSTRACT

The invention discloses a display panel, comprising: a first substrate including a display region and a peripheral region adjacent to each other; a plurality of pixel units disposed on the first substrate and located in the display region; a control circuit disposed on the first substrate, located in the peripheral region and electrically connected to the pixel units; a planarization layer disposed on the first substrate, extending from the display region to the peripheral region and covering the pixel units and the control circuit; and a bonding pad disposed on the first substrate and located above the planarization layer; wherein a projection area of the bonding pad on the first substrate and a projection area of the control circuit on the first substrate have an overlapped region.

9 Claims, 3 Drawing Sheets

(58) Field of Classification Search
USPC .......................................................... 257/59
See application file for complete search history.

(56) References Cited

U.S. PATENT DOCUMENTS

| | | | | |
|---|---|---|---|---|
| 2011/0309378 | A1* | 12/2011 | Lau | H01L 27/1214 438/26 |
| 2012/0107967 | A1* | 5/2012 | Or-Bach | H01L 23/528 257/E21.705 |
| 2012/0129301 | A1* | 5/2012 | Or-Bach | H01L 29/66833 438/129 |
| 2012/0319144 | A1* | 12/2012 | Fujikawa | G02F 1/1345 257/E27.121 |
| 2013/0119557 | A1* | 5/2013 | Or-Bach | H01L 27/11898 257/774 |
| 2014/0034949 | A1* | 2/2014 | Matsukura | H01L 27/1244 257/52 |
| 2015/0163942 | A1 | 6/2015 | Wu | |
| 2017/0047353 | A1* | 2/2017 | Kimura | G02F 1/136213 |
| 2017/0069612 | A1* | 3/2017 | Zhang | G03B 21/2033 |
| 2018/0076232 | A1* | 3/2018 | Kimura | H01L 27/1255 |
| 2018/0330653 | A1 | 11/2018 | Zhou | |
| 2018/0358469 | A1* | 12/2018 | Uchida | H01L 27/1225 |
| 2019/0189720 | A1* | 6/2019 | Lim | H10K 59/131 |
| 2019/0189721 | A1* | 6/2019 | Kim | H10K 59/124 |
| 2021/0028194 | A1* | 1/2021 | Kimura | G02F 1/1339 |
| 2021/0083033 | A1* | 3/2021 | Bang | H10K 59/40 |
| 2021/0134643 | A1* | 5/2021 | Or-Bach | H01L 29/7841 |
| 2021/0134645 | A1* | 5/2021 | Or-Bach | H10B 12/053 |
| 2021/0159108 | A1* | 5/2021 | Or-Bach | H01L 29/792 |
| 2022/0102583 | A1* | 3/2022 | Baumheinrich | H01L 27/156 |

\* cited by examiner

DISPLAY PANEL

BACKGROUND OF THE INVENTION

1. Field of the Invention

The invention relates to a display panel, and particularly to a display panel designed with a narrow bezel.

2. Related Art

With development of science and technology, display devices are widely applied to many electronic products, such as, mobile phones, tablet computers, watches, and the like. Meanwhile, in order to meet more requirements, most of the electronic products are mounted with elements having an optical sensing function, such as, cameras.

Recently, in order to reduce a proportion of the non-display region, the display panel is gradually developed towards design of a narrow bezel. FIG. 1 is a structural diagram of a display panel in the prior art. As shown in FIG. 1, the display panel 10 has a display region AA where a pixel structure and a pixel circuit are formed, and a peripheral region BA where a control circuit 11, a fanout wiring 12 and a bonding pad 13 are formed, and in the region forming the bonding pad 13, a planarization layer 14 is removed. To make full use of an area of the peripheral region, the current method is to use the way of at least partially overlapping the control circuit 11 and the fanout wiring 12. In the current display panel, since the planarization layer 14 is removed in the region forming the bonding pad 13, and the control circuit 11 and the fanout wiring 12 are overlapped, a short circuit between the control circuit 11 and the fanout wiring 12, noise interference on data lines, and penetration of moisture from the peripheral region BA into the display region AA are easily caused, resulting in a display error, even failure of the display panel.

Therefore, how to better reduce an area of the non-display region, and avoid a short circuit between the control circuit and the fanout wiring, and interference on data lines is actually one of the problems to be solved.

SUMMARY OF THE INVENTION

To solve the above problem, the invention provides a display panel, which can better meet the requirement for design of a narrow bezel, avoid a short circuit between the control circuit and the fanout wiring, and interference on data lines, and improve display effect and yield of the display panel.

A display panel in one embodiment of the invention comprises a first substrate including a display region and a peripheral region adjacent to each other; a plurality of pixel units disposed on the first substrate and located in the display region; a control circuit disposed on the first substrate, located in the peripheral region and electrically connected to the pixel units; a planarization layer disposed on the first substrate, extending from the display region to the peripheral region and covering the pixel units and the control circuit; and a bonding pad disposed on the first substrate and located above the planarization layer; wherein a projection area of the bonding pad on the first substrate and a projection area of the control circuit on the first substrate have an overlapped region.

A display panel in another embodiment of the invention comprises a first substrate including a display region and a peripheral region adjacent to each other; a plurality of pixel units disposed on the first substrate and located in the display region; a wiring structure disposed on the first substrate, located in the peripheral region and electrically connected to the pixel units; a planarization layer disposed on the first substrate, extending from the display region to the peripheral region and covering the pixel units and the wiring structure; and a bonding pad disposed on the first substrate, located above the planarization layer and electrically connected to the wiring structure; wherein a projection area of the bonding pad on the first substrate and a projection area of the wiring structure on the first substrate have an overlapped region.

Hereinafter the invention is described in details with reference to the accompanying drawings and the detailed embodiments, but the invention is not limited thereto.

PREFERABLE EMBODIMENTS OF THE INVENTION

Figure 1:
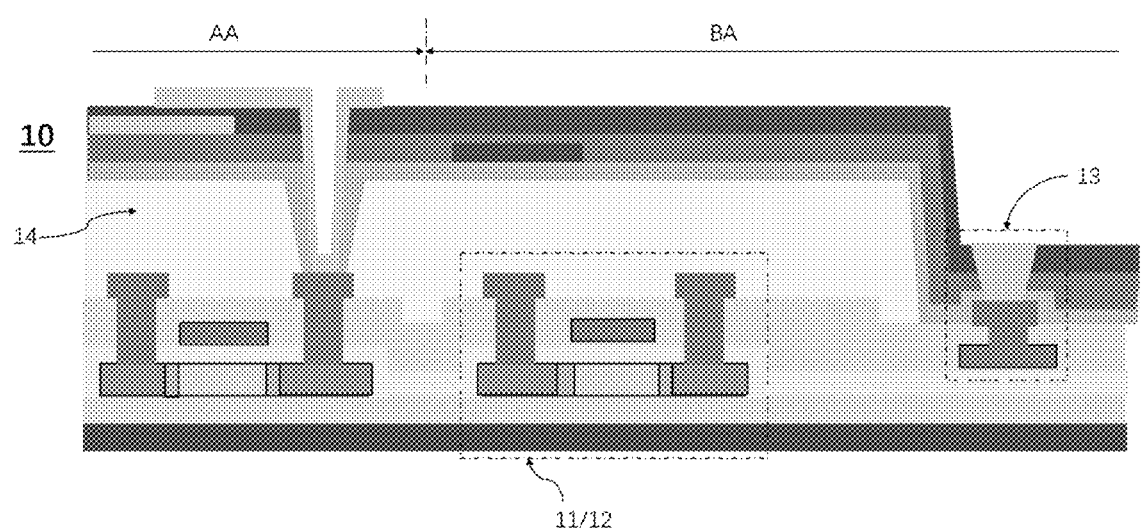
FIG. 1 is a structural diagram of a display panel in the prior art.
Figure 2:
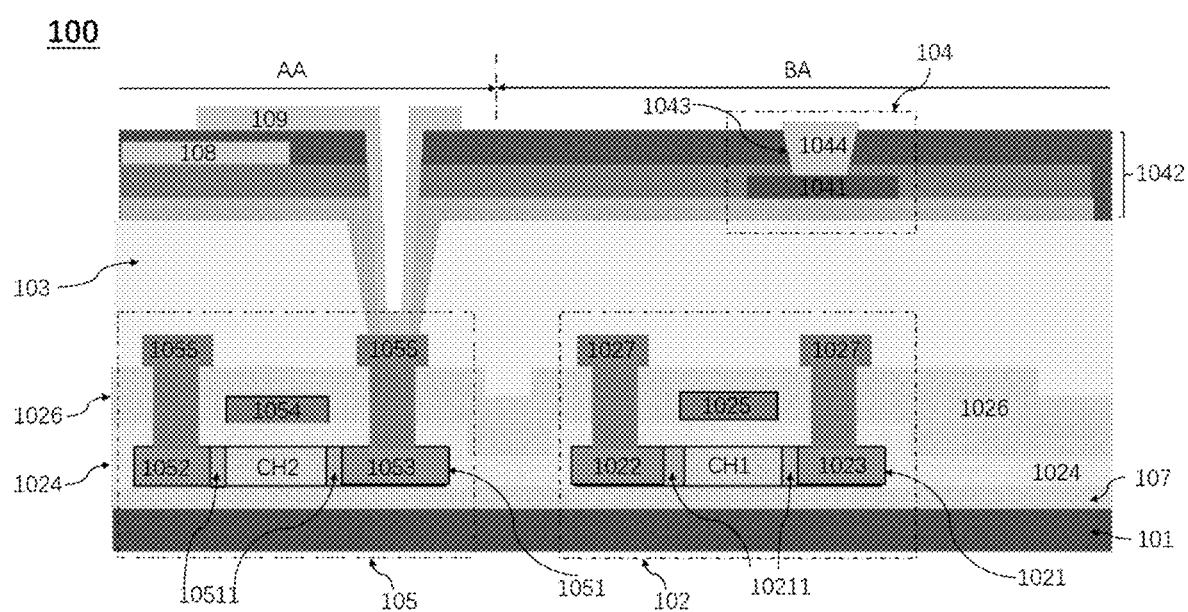
FIG. 2 is a structural diagram of a display panel in one embodiment of the invention.

Hereinafter structure principle and working principle of the invention are described in details with reference to the accompanying drawings:

FIG. 2 is a structural diagram of a display panel in one embodiment of the invention. As shown in FIG. 2, the display panel 100 comprises a first substrate 101, and a control circuit 102, a planarization layer 103 and a bonding pad 104 disposed on the first substrate 101. The first substrate 101 has a display region AA and a peripheral region BA adjacent to each other, and the display region AA is provided with a plurality of pixel units (not shown) in a matrix arrangement. The control circuit 102 is disposed in the peripheral region BA, and electrically connected to the pixel units in the display region AA to drive the pixel units to display. The planarization layer 103 is disposed in the display region AA and the peripheral region BA, and covers the pixel units in the display region AA and the control circuit 102 in the peripheral region. The bonding pad 104 is disposed above the planarization layer 103, and projection areas of the bonding pad 104 and the control circuit 102 on the first substrate 101 have an overlapped region. In this embodiment, the display panel 100 further comprises a buffer layer 107 formed on the first substrate 101, but the invention is not limited thereto.

Specifically, as shown in FIG. 2, the control circuit 102 comprises a first semiconductor layer 1021 disposed on the first substrate 101, and having a first doped region 1022, a second doped region 1023, and a first channel region CH1 located between the first doped region 1022 and the second doped region 1023. Of course, in this embodiment, lightly doped regions 10211 are formed between the first channel region CH1 and the first doped region 1022 as well as the second doped region 1023, respectively, but the invention is not limited thereto. A gate insulating layer 1024 is formed on the first semiconductor layer 1021, and covers the first semiconductor layer 1021, and a first metal layer 1025 is disposed on the gate insulating layer 1024, and corresponds to a position of the first channel region CH1. A first insulating layer 1026 is formed on the first metal layer 1025, and covers the first metal layer 1025. A second metal layer 1027 is formed on the first insulating layer 1026, and connected to the first doped region 1022 or the second doped region 1023 through a via hole formed in the first insulating layer 1026.

Referring to FIG. 2 again, the bonding pad 104 is formed on the planarization layer 103. The specific structure of the bonding pad 104 is that a third metal layer 1041 is disposed on the planarization layer 103, a second insulating layer 1042 is formed on the third metal layer 1041 and covers the third metal layer 1041, and a bonding pad opening 1043 is formed in the second insulating layer 1042. Further, a fourth metal layer 1044 is formed in the bonding pad opening 1043, and electrically connected to the third metal layer 1041. In this embodiment, the second insulating layer 1042 is a multi-layered structure. Of course, the second insulating layer 1042 also can be a single-layered or other multi-layered structure, but the invention is not limited thereto.

Meanwhile, as shown in FIG. 2, in the display region AA, the pixel units include a plurality of thin film transistors 105, and the thin film transistor 105 includes a second semiconductor layer 1051 formed on the first substrate 101, and having a third doped region 1052, a fourth doped region 1053, and a second channel region CH2 located between the third doped region 1052 and the fourth doped region 1053. Of course, lightly doped regions 10511 are formed between the second channel region CH2 and the third doped region 1052 as well as the fourth doped region 1053, respectively, but the invention is not limited thereto. A gate insulating layer 1024 is formed on the second semiconductor layer 1051, and covers the second semiconductor layer 1051. A gate metal layer 1054 is formed on the gate insulating layer 1024 and corresponds to a position of the second channel region CH2. In this embodiment, the gate metal layer 1054 can be made of the same film layer as the first metal layer 1025. A first insulating layer 1026 is formed on the gate metal layer 1054, and covers the gate metal layer 1054. A source/drain metal layer 1055 is formed on the first insulating layer 1026, and connected to the third doped region 1052 or the fourth doped region 1053 through a via hole formed in the first insulating layer 1026. In this embodiment, the source/drain metal layer 1055 can be made of the same film layer as a second metal layer 1027. The planarization layer 103 covers the source/drain metal layer 1055 and the first insulating layer 1026, and the second insulating layer 1042 is formed on the planarization layer 103. A common electrode 108 is formed between the planarization layer 103 and the second insulating layer 1042, and electrically connected to the pixel units in the display region AA and the control circuit 102 in the peripheral region BA. A pixel electrode 109 is also disposed on the second insulating layer 1042, and electrically connected to the source/drain metal layer 1055 through via holes formed on the second insulating layer 1042 and the planarization layer 103. The common electrode 108 and the pixel electrode 109 are often made of a transparent conductive layer (ITO1, ITO2), and the transparent conductive layer (ITO1, ITO2) can be a transparent conductive layer such as an indium tin oxide, an indium zinc oxide, an aluminum tin oxide, an aluminum zinc oxide, or an indium germanium zinc oxide, but the invention is not limited thereto. In addition, the fourth metal layer 1044 in the bonding pad 104 is made of the same film layer as the pixel electrode 109, and also can be the transparent conductive layer as described.

Figure 3:
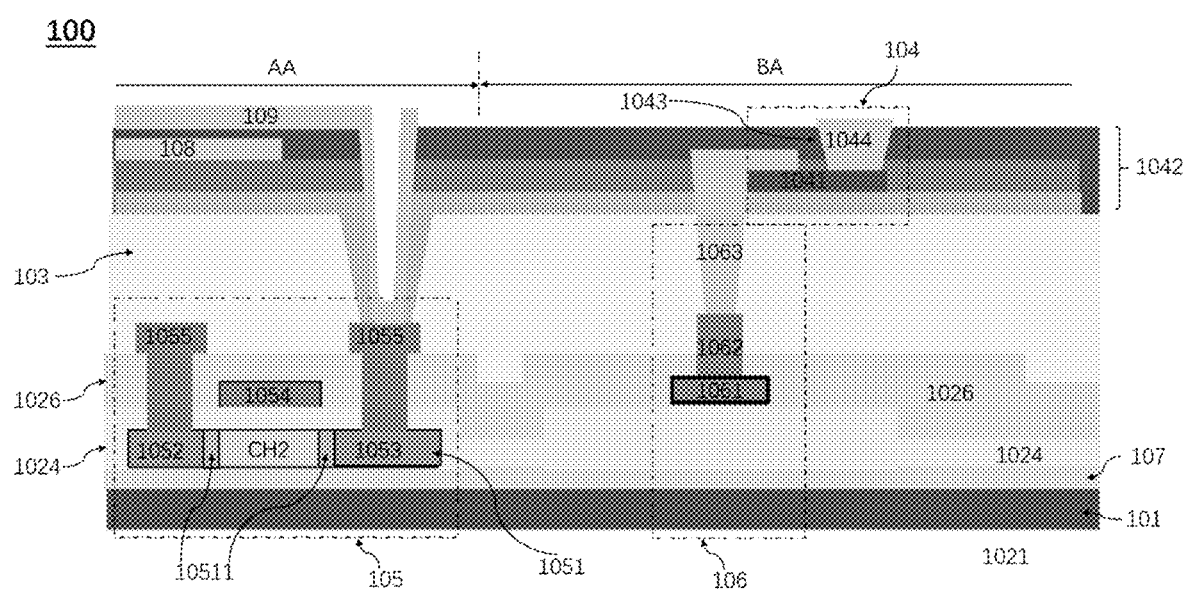
FIG. 3 is a structural diagram of a display panel in another embodiment of the invention.

FIG. 3 is a structural diagram of a display panel in another embodiment of the invention. As shown in FIG. 3, the embodiment of FIG. 3 differs from the embodiment of FIG. 2 in that not only the control circuit 102, but also a wiring structure 106 may be formed in the peripheral region BA of the display panel 100. The wiring structure 106 is electrically connected to the pixel units in the display region AA to transmit control and data signals. The bonding pad 104 is formed above the wiring structure 106, and projection areas of the bonding pad 104 and the wiring structure 106 on the first substrate 101 have an overlapped region.

Specifically, as shown in FIG. 3, the wiring structure 106 comprises the gate insulating layer 1024 disposed on the first substrate 101, a first wiring metal layer 1061 formed on the gate insulating layer 1024, wherein the first insulating layer 1026 is formed on the first wiring metal layer 1061 and covers the first wiring metal layer 1061, and a second wiring metal layer 1062 formed on the first insulating layer 1026 and electrically connected to the first wiring metal layer 1061 through a via hole in the first insulating layer 1026. In addition, a fifth metal layer 1063 is formed on the planarization layer 103, and electrically connected to the third metal layer 1041 in the bonding pad 104 and the second wiring metal layer 1062 in the wiring structure 106, respectively. That is, the wiring structure 106 and the bonding pad 104 are electrically connected through the fifth metal layer 1063. In this embodiment, the first wiring metal layer 1061 can be made of the same film layer as the first metal layer 1025, and the second wiring metal layer 1062 can be made of the same film layer as the second metal layer 1027. The fifth metal layer 1063 can be made of the same film layer as the common electrode 108, and also can be the transparent conductive layer as described.

The two embodiments specifically introduce the case of forming the control circuit 102 or the wiring structure 106 in a vertical lower region of the bonding pad 104 relative to the first substrate 101. However, generally, in the display panel 100, the control circuit and/or the wiring structure 106 also may be formed simultaneously below the bonding pad 104, and the details are not described here. In addition, a circuit board is also formed in the display panel 100, and electrically connected to the bonding pad 104 to transmit signals with the display panel 100 through the bonding pad 104.

In conclusion, according to the embodiments of the invention, since the bonding pad is formed above the control circuit and/or the wiring structure, i.e., an overlapped region is formed between the bonding pad and the control circuit and/or the wiring structure, a vertical space of the peripheral region is fully used, and a shared horizontal space exists between the bonding pad and the control circuit and/or the wiring structure. Therefore, the invention further reduces a width of the peripheral region of the display panel, and can be better adapted to the design of a narrow bezel. Meanwhile, since the planarization layer extends from the display region to the peripheral region of the display panel, penetration of moisture into the display region can be effectively prevented. Moreover, since an overlapped region is not formed between the control circuit and the wiring structure, a short circuit therebetween and signal interference can be avoided.

Of course, the invention also may have various other embodiments, and those skilled in the art shall make various corresponding changes and variations without departing from spirit and essence of the invention, but these corresponding changes and variations shall belong to the scope protected by the appended claims of the invention.

INDUSTRIAL PRACTICABILITY

Application of the display panel of the invention has the following advantageous effects:

since the bonding pad is formed above the control circuit and/or the wiring structure, i.e., an overlapped region is formed between the bonding pad and the control circuit and/or the wiring structure, a vertical space in the peripheral region is fully used, and a shared horizontal space exists between the bonding pad and the control circuit and/or the wiring structure. Therefore, the invention further reduces a width of the peripheral region of the display panel, and can be better adapted to the design of a narrow bezel. Meanwhile, since the planarization layer extends from the display region to the peripheral region of the display panel, penetration of moisture into the display region can be effectively prevented. Moreover, since an overlapped region is not formed between the control circuit and the wiring structure, a short circuit therebetween and signal interference can be avoided.

What is claimed is:

1. A display panel, comprising:
a first substrate including a display region and a peripheral region adjacent to each other;
a plurality of pixel units disposed on the first substrate and located in the display region;
a control circuit disposed on the first substrate, located in the peripheral region and electrically connected to the pixel units;
a planarization layer disposed on the first substrate, extending from the display region to the peripheral region and covering the pixel units and the control circuit; and
a bonding pad disposed on the first substrate and located above the planarization layer;
a projection area of the bonding pad on the first substrate and a projection area of the control circuit on the first substrate have an overlapped region;
the control circuit includes:
a first semiconductor layer disposed on the first substrate, and having a first doped region, a second doped region, and a first channel region located between the first doped region and the second doped region;
a gate insulating layer covering the first semiconductor layer;
a first metal layer disposed on the gate insulating layer and corresponding to the first channel region;
a first insulating layer covering the first metal layer; and
a second metal layer disposed on the first insulating layer and connected to the first doped region or the second doped region;
the planarization layer covers the first metal layer, the second metal layer and the first insulating layer;
the bonding pad includes:
a third metal layer disposed on the planarization layer;
a second insulating layer covering the third metal layer and formed with a bonding pad opening; and
a fourth metal layer disposed in the bonding pad opening and connected to the third metal layer;
wherein the pixel units include a plurality of thin film transistors, each of the thin film transistors including:
a second semiconductor layer disposed on the first substrate, and having a third doped region, a fourth doped region, and a second channel region located between the third doped region and the fourth doped region, wherein the gate insulating layer covers the second semiconductor layer;
a gate metal layer disposed on the gate insulating layer and corresponding to the second channel region, the first insulating layer covering the gate metal layer, wherein the gate metal layer and the first metal layer are made of the same material;
a source/drain metal layer disposed on the first insulating layer and connected to the third doped region or the fourth doped region, the planarization layer covering the source/drain metal layer and the first insulating layer, respectively, and the second insulating layer covering the planarization layer, wherein the source/drain metal layer and the second metal layer are made of the same material;
a common electrode disposed on the planarization layer; and
a pixel electrode disposed on the second insulating layer and electrically connected to the source/drain metal layer, wherein the pixel electrode and the fourth metal layer are made of the same material.

2. The display panel according to claim 1, further comprising a wiring structure disposed in the peripheral region, and including:
a first wiring metal layer disposed on the gate insulating layer, wherein the first wiring metal layer and the first metal layer are made of the same material, and the first insulating layer covers a part of the first wiring metal layer; and
a second wiring metal layer connected to the first wiring metal layer, wherein the second wiring metal layer and the second metal layer are made of the same material;
wherein the display panel further comprises a fifth metal layer disposed above the planarization layer and electrically connected to the second wiring metal layer and the bonding pad, respectively, wherein the fifth metal layer and the common electrode are made of the same material.

3. The display panel according to claim 2, wherein the fourth metal layer, the common electrode, the pixel electrode or the fifth metal layer can be a transparent conductive layer.

4. The display panel according to claim 3, wherein the transparent conductive layer can be made of a metal oxide conductive material.

5. The display panel according to claim 4, wherein the metal oxide conductive material can be an indium tin oxide, an indium zinc oxide, an aluminum tin oxide, an aluminum zinc oxide, or an indium germanium zinc oxide.

6. The display panel according to claim 1, further comprising a circuit board disposed on the bonding pad and electrically connected to the bonding pad.

7. A display panel, comprising:
a first substrate including a display region and a peripheral region adjacent to each other;
a plurality of pixel units disposed on the first substrate and located in the display region;
a wiring structure disposed on the first substrate, located in the peripheral region and electrically connected to the pixel units;
a planarization layer disposed on the first substrate, extending from the display region to the peripheral region and covering the pixel units and the wiring structure; and
a bonding pad disposed on the first substrate, located above the planarization layer and electrically connected to the wiring structure;
a projection area of the bonding pad on the first substrate and a projection area of the wiring structure on the first substrate have an overlapped region;
the wiring structure includes:
a gate insulating layer disposed on the first substrate;

a first wiring metal layer disposed on the gate insulating layer;

a first insulating layer covering the first wiring metal layer; and a second wiring metal layer disposed on the first insulating layer and connected to the first wiring metal layer;

the bonding pad includes:

a third metal layer disposed on the planarization layer;

a second insulating layer covering the third metal layer and formed with a bonding pad opening; and a fourth metal layer disposed in the bonding pad opening and connected to the third metal layer;

wherein the pixel units include a plurality of thin film transistors, each of the thin film transistors including:

a second semiconductor layer disposed on the first substrate, and having a third doped region, a fourth doped region, and a second channel region located between the third doped region and the fourth doped region, wherein the gate insulating layer covers the second semiconductor layer;

a gate metal layer disposed on the gate insulating layer and corresponding to the second channel region, the first insulating layer covering the gate metal layer, wherein the gate metal layer and the first wiring metal layer are made of the same material;

a source/drain metal layer disposed on the first insulating layer and connected to the third doped region or the fourth doped region, the planarization layer covering the source/drain metal layer and the first insulating layer, respectively, and the second insulating layer covering the planarization layer, wherein the source/drain metal layer and the second wiring metal layer are made of the same material;

a common electrode disposed on the planarization layer; and a pixel electrode disposed on the second insulating layer and electrically connected to the source/drain metal layer, wherein the pixel electrode and the fourth metal layer are made of the same material.

8. The display panel according to claim 7, further comprising a fifth metal layer through which the bonding pad and the wiring structure are electrically connected.

9. The display panel according to claim 7, further comprising a circuit board disposed on the bonding pad and electrically connected to the bonding pad.

* * * * *